(12) United States Patent
Koura

(10) Patent No.: US 11,773,483 B2
(45) Date of Patent: Oct. 3, 2023

(54) CABINET FOR SOLID MATERIAL CONTAINER

(71) Applicant: L'Air Liquide, Société Anonyme pour l'Etude et l'Exploitation des Procédés Georges Claude, Paris (FR)

(72) Inventor: Terumasa Koura, Tsukuba (JP)

(73) Assignee: L'Air Liquide, Societe Anonyme Pour L'Etude Et L'Exploitation Des Procedes Georges Claude, Paris (FR)

( * ) Notice: Subject to any disclaimer, the term of this patent is extended or adjusted under 35 U.S.C. 154(b) by 232 days.

(21) Appl. No.: 15/931,494

(22) Filed: May 13, 2020

(65) Prior Publication Data

US 2020/0362454 A1    Nov. 19, 2020

(30) Foreign Application Priority Data

May 14, 2019    (JP) ................................ 2019-091137

(51) Int. Cl.
*C23C 14/54* (2006.01)
*C23C 14/24* (2006.01)

(52) U.S. Cl.
CPC .............. *C23C 14/54* (2013.01); *C23C 14/24* (2013.01)

(58) Field of Classification Search
None
See application file for complete search history.

(56) References Cited

U.S. PATENT DOCUMENTS

| | | | |
|---|---|---|---|
| 4,989,160 A * | 1/1991 | Garrett | H01L 21/67253 700/282 |
| 6,076,359 A * | 6/2000 | Jurcik | F17C 13/084 219/521 |
| 6,319,327 B1 | 11/2001 | Tsukada et al. | |
| 9,447,497 B2 | 9/2016 | Wu et al. | |
| 10,266,941 B2 | 4/2019 | Lee et al. | |
| 2006/0032550 A1* | 2/2006 | Wodjenski | F17C 13/045 141/248 |
| 2009/0211525 A1 | 8/2009 | Sarigiannis et al. | |
| 2009/0283040 A1 | 11/2009 | Reinhold et al. | |
| 2010/0162685 A1* | 7/2010 | Hirshberg | F25B 9/00 165/185 |
| 2010/0322604 A1* | 12/2010 | Fondurulia | C23C 16/4481 392/451 |

FOREIGN PATENT DOCUMENTS

| | | |
|---|---|---|
| JP | 2019 008741 | 1/2019 |
| KR | 2012 0009224 | 2/2012 |
| TW | 200 949 123 | 12/2009 |

OTHER PUBLICATIONS

EP Search Report and Written Opinion for EP 20 17 1721, dated Oct. 6, 2020.

* cited by examiner

*Primary Examiner* — Charles Capozzi
(74) *Attorney, Agent, or Firm* — Yan Jiang

(57) ABSTRACT

A cabinet for a solid material container comprises a main body having a top wall, a side wall, and a bottom wall; an entry/exit portion which is attached to a portion of the main body, for putting in and taking out the solid material container; an exhaust duct attached to a portion of the main body; a heating portion for heating the solid material container; a temperature measuring portion for measuring a temperature of the solid material container, or of the heating portion; and a cooling blower for blowing cooling air toward the solid material container.

8 Claims, 4 Drawing Sheets

CABINET FOR SOLID MATERIAL CONTAINER

CROSS REFERENCE TO RELATED APPLICATIONS

This application claims the benefit of priority under 35 U.S.C. § 119 (a) and (b) to Japanese Patent Application No. 2019-091137, filed May 14, 2019, the entire contents of which are incorporated herein by reference.

BACKGROUND

The present invention relates to a cabinet for accommodating a solid material container filled with a solid material for manufacturing a semiconductor.

Advances in the semiconductor industry require the use of new semiconductor materials that will satisfy strict thin film requirements, These materials are used in a wide variety of applications for depositing and shaping thin films in semiconductor products.

Examples of solid materials (also referred to as solid precursor materials) that may be mentioned include constituent components for barrier layers, high dielectric constant/low dielectric constant insulating films, metal electrode films, interconnecting layers, ferroelectric layers, silicon nitride layers, or silicon oxide layers. In addition, constituent components which act as dopants for compound semiconductors, and etching materials, may be mentioned as solid precursors. Exemplary precursor materials that may be mentioned include inorganic compounds and organometallic compounds of aluminium, barium, bismuth, chromium, cobalt, copper, gold, hafnium, indium, iridium, iron, lanthanum, lead, magnesium, molybdenum, nickel, niobium, platinum, ruthenium, silver, strontium, tantalum, titanium, tungsten, yttrium and zirconium.

Some of these new materials are in a solid form at standard temperatures and pressures, and therefore cannot be supplied directly into semiconductor deposition chambers for manufacturing processes.

These materials generally have very high melting points and low vapour pressures, and must therefore be vaporized/sublimated by being heated inside a solid material container, before being supplied to the deposition chamber.

In order to supply a sufficient quantity of vapour for use in a semiconductor manufacturing process, sufficient heat input is required from the solid material container to the solid material during heating.

Since the heat of vaporization is lost when a solid material is vaporised, the temperature of the solid material surface decreases when the supply of the solid material vapour begins. Thereupon, since the vapour pressure of the solid material decreases in relation to the amount of the drop in temperature, the quantity of vapour discharged from the solid material container decreases as supply time elapses, Such a variation in the quantity of vapour discharged impedes uniform deposition in the semiconductor manufacturing process and is therefore not preferable.

For this reason, solid material containers are generally designed to be heavy. This is because increasing the weight increases the amount of heat in the solid material container itself, thereby making it possible for an amount of heat to be supplied rapidly to the solid material surface that has decreased in temperature as a result of the vaporisation.

Now, a solid material container is disposed in close proximity to a semiconductor manufacturing device in order to supply solid material vapour to the semiconductor manufacturing device. Here, when the solid material inside the solid material container has been consumed, the solid material container is exchanged with another solid material container filled with solid material.

In order to carry out the solid material container exchange operation, the solid material container must be cooled to around room temperature, from the point of view of safety. Further, taking into account progression of the semiconductor process, cooling must be performed as quickly as possible.

PRIOR ART

Patent literature article 1 discloses a device in which a plurality of auto cylinder boxes are stored in a cylinder cabinet chamber, and which controls the supply of gas.

PATENT LITERATURE 1—Japanese Unexamined Patent Publication No. 2019-8741

SUMMARY OF INVENTION

Patent literature article 1 described hereinabove mentions that a control device 11 transmits gas supply pathway information (state information) to a monitoring control device 20, and the gas supply pathway information is displayed by a display unit 204. Examples of gas supply pathway information that may be mentioned include valve open/closed, pressure information, temperature information, and normal/abnormal state information. Furthermore, in the configuration in Patent Literature Article 1, a plurality of cabinets (cylinders) are used in parallel, so that when all the cylinders in one cabinet have been used, switching to the cylinders in another cabinet is carried out, and the used cylinders are allowed to cool naturally.

In consideration of this situation, the objective of the present invention is to provide a cabinet for a solid material container, with which a solid material container inside the cabinet can be cooled quickly, and with which the time required for work to exchange the solid material container in the cabinet can be reduced.

A cabinet for a solid material container according to the present invention is provided with:

a main body having a top wall, a side wall, and a bottom wall;

an entry/exit portion (door) which is attached to a portion of the main body, for putting in and taking out the solid material container;

an exhaust duct attached to a portion of the main body (for example, the top wall, or a side wall separated from the entry/exit portion);

a heating portion (for example, a detachable electric heater jacket) for heating the solid material container;

a temperature measuring portion for measuring a temperature of the solid material container (for example, an outer wall surface or an internal space), or of the heating portion (for example, a heat source, or a portion in contact with the solid material container); and a cooling blower for blowing cooling air toward the solid material container.

The flow rate per unit time of the cooling blower may be similar to that of a blowing means of the exhaust duct, or that of the cooling blower may be higher (for example, at least 1.5 times, at least 2 times, or at least 3 times higher) than that of the blowing means of the exhaust duct.

The cooling blower may be provided in the entry/exit portion (door), or may be provided in the side wall or the bottom wall. The door may be a double door, a single door, or a sliding door, for example.

The cooling blower may be provided in a blowing portion (the side facing the solid material container) with a hood for adjusting the wind direction.

In the cooling blower, an opening surface area of an intake portion and an opening surface area of the blowing portion may be the same or substantially the same. "Substantially" may mean a difference of approximately ±[1 to 10]%.

In the cooling blower, the opening surface area of the blowing portion may be smaller than the opening surface area of the intake portion.

The shape of the opening portion of the intake portion may be circular, elliptical, or rectangular.

The shape of the opening portion of the blowing portion may be circular, elliptical, or rectangular.

The shortest distance between a hood distal end of the blowing portion and the solid material container or the heating portion covering the solid material container is preferably at most equal to 10 cm. The solid material container is disposed inside the cabinet in such a way that the hood distal end of the blowing portion does not come into contact with the solid material container or the heating portion covering the solid material container.

The cabinet for the solid material container may be provided with
  an operation input portion (for example, a touch panel) for inputting prescribed operational values, and
  a display portion (for example, a touch panel) for displaying a measured temperature measured by the temperature measuring portion and/or a set temperature set in the heating portion.

The cabinet for the solid material container may be provided with a weight measuring portion (for example, a load cell) for measuring the weight of the solid material container.

The cabinet for the solid material container is provided with a cabinet control portion which performs various types of control.

The cabinet control portion may control the heating portion in such a way that the inside of the solid material container reaches a prescribed temperature (for example, a temperature range in which the solid material vaporises) (in accordance with an instruction from a process control device which controls each semiconductor manufacturing device, or in accordance with a sublimed gas supply start input instruction).

The cabinet control portion or the process control device may monitor the measured temperature measured by the temperature measuring portion (for example, by receiving the measured temperature from the temperature measuring portion in real-time or with a prescribed timing), and if a prescribed temperature range is reached (or a threshold is exceeded), control opening and closing of an inlet valve of the solid material container and/or a control valve disposed in a carrier gas introduction pipe which introduces a carrier gas from a carrier gas source (for example, a carrier gas container) into the solid material container, by sending instructions to the valves, in such a way that the carrier gas is introduced into the solid material container, The cabinet control portion or the process control device may monitor the temperature measured by the temperature measuring portion (for example, by receiving the measured temperature from the temperature measuring portion in real-time or with a prescribed timing), and if a prescribed temperature range is reached (or a threshold is exceeded), control opening and closing of an outlet valve of the solid material container and/or a control valve disposed in a sublimed gas delivery pipe which feeds an entrained gas of a sublimed gas obtained by vaporisation of the solid material, and the carrier gas, from the solid material container to a semiconductor manufacturing device side, by sending instructions to the valves, in such a way that the sublimed gas and the carrier gas are entrained with one another and are supplied to the semiconductor manufacturing device.

The solid material container may be provided with a pressure gauge for measuring the internal pressure therein (or the entrained gas pressure).

The sublimed gas delivery pipe may be provided with a pressure gauge for measuring the internal pressure therein (or the entrained gas pressure). The sublimed gas delivery pipe may be provided with a flow rate regulating portion and/or a pressure regulating portion for flow rate regulation and/or pressure regulation of the entrained gas.

The cabinet control portion or the process control device may control the entrained gas flow rate regulating portion and/or pressure regulating portion.

The carrier gas introduction pipe may be provided with a carrier gas flow rate regulating portion and/or pressure regulating portion for flow rate regulation and/or pressure regulation of the carrier gas. Further, the carrier gas introduction pipe may be provided with a flowmeter for measuring the flow rate of the carrier gas, and/or a pressure gauge for measuring the pressure thereof.

The cabinet control portion or the process control device may control the carrier gas flow rate regulating portion and/or pressure regulating portion.

If the weight measured by the weight measuring portion becomes equal to or less than a threshold, the cabinet control portion may send information (for example, the weight) relating thereto, or information indicating that the replacement timing has been reached, to the process control device. Alternatively, the weight measuring portion may send the measured weight to the process control device directly or via a data transfer device (provided with a memory and a communication portion, for example).

The "threshold" may, for example, be a value obtained by subtracting 80% to 95% of the weight of the filled solid material from the weight of the solid material container and accessories.

If the weight measured by the weight measuring portion becomes equal to or less than a threshold, the cabinet control portion may close the control valve disposed in the sublimed gas delivery pipe and/or the outlet valve of the solid material container by sending instructions thereto, and/or may close the control valve disposed in the carrier gas introduction pipe and/or the inlet valve of the solid material container by sending instructions thereto, in such a way as to stop the feed of the entrained gas to the semiconductor manufacturing device.

The "threshold" may, for example, be a value obtained by subtracting 85% to 95% of the weight of the solid material filling the solid material container from the weight of the solid material container and accessories.

The cabinet control portion may obtain a residual quantity of the solid material by calculation, from the carrier gas flow rate (measured value from flowmeter, measured value measured by flow rate regulating portion), the saturated vapour pressure (fixed value depending on solid material), and the entrained gas feeding time (time measured using timer function).

If the residual quantity becomes equal to or less than a threshold, the cabinet control portion may send information relating thereto, or information indicating that the replacement timing has been reached, to the process control device.

If the residual quantity becomes equal to or less than a threshold, the cabinet control portion may close the control valve disposed in the sublimed gas delivery pipe and/or the outlet valve of the solid material container by sending instructions thereto, and/or may close the control valve disposed in the carrier gas introduction pipe and/or the inlet valve of the solid material container by sending instructions thereto, in such a way as to stop the feed of the entrained gas to the semiconductor manufacturing device, The "threshold" may, for example, be 1% to 10% of the weight of the solid material filling the solid material container.

The cabinet control portion may drive the cooling blower after stopping the feed of the entrained gas to the semiconductor manufacturing device (after valve closing), to cool the solid material container until the temperature of the solid material container is equal to or less than the threshold.

The cabinet control portion may stop the cooling blower when the temperature of the solid material container becomes equal to or less than the threshold.

The temperature of the solid material container may be the temperature measured by the temperature measuring portion if the temperature measuring portion is in contact with the solid material container, or may be a temperature measured by a thermometer disposed in the solid material container or measured by a non-contact type thermometer installed in the cabinet and set in such a way as to measure an outer surface temperature of the solid material container.

The "threshold" is, for example, 50° C. or lower, 40° or lower, or atmospheric temperature or lower.

The cooling blower is not limited to being driven or stopped automatically, and may be driven or stopped by means of a manual input by an operator from an operation input portion. Further, the cooling blower may be stopped by pressing an emergency stop switch (button) different from the operation input portion.

The cabinet control portion may cause exhausting to begin by driving a duct ventilation blower of the exhaust duct before, at the same time as, or after driving the cooling blower.

At least the side surface of the solid material container may be covered by the heating portion. Cooling may start after the heating portion (for example, a detachable electric heater jacket) has been removed prior to cooling.

The cabinet control portion is configured to be capable of transmitting and receiving (irrespective of whether by wireless or by wire) data and control commands to or from the operation input portion, various instruments (flowmeter, pressure gauge, flow rate regulating portion, pressure regulating portion, temperature measuring portion and the like), and the process control device.

According to the present invention, the solid material container inside the cabinet can be cooled quickly, and the time required for work to exchange the solid material container in the cabinet can be reduced.

BRIEF DESCRIPTION OF THE DRAWINGS

For a further understanding of the nature and objects for the present invention, reference should be made to the following detailed description, taken in conjunction with the accompanying drawings, in which like elements are given the same or analogous reference numbers and wherein.

DETAILED DESCRIPTION OF PREFERRED EMBODIMENTS

Embodiment 1

Figure 1A:
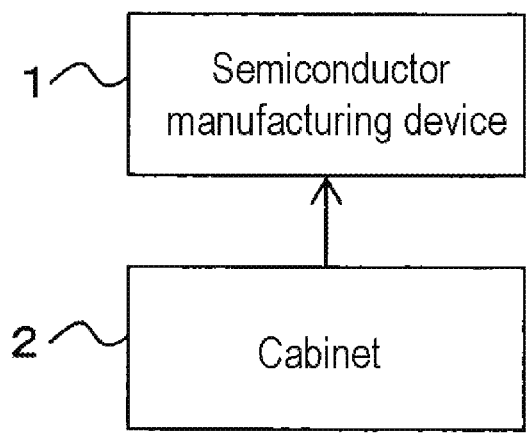
FIG. 1A is a functional block diagram of a semiconductor manufacturing device and a cabinet in Embodiment 1.

FIG. 1A illustrates an example of a semiconductor manufacturing device 1 and a cabinet 2 in Embodiment 1. In FIG. 1A, a sublimed gas is fed to the semiconductor manufacturing device 1 together with a carrier gas from a solid material container installed inside the cabinet 2. The configuration of the cabinet 2 is discussed hereinafter.

Figure 1B:
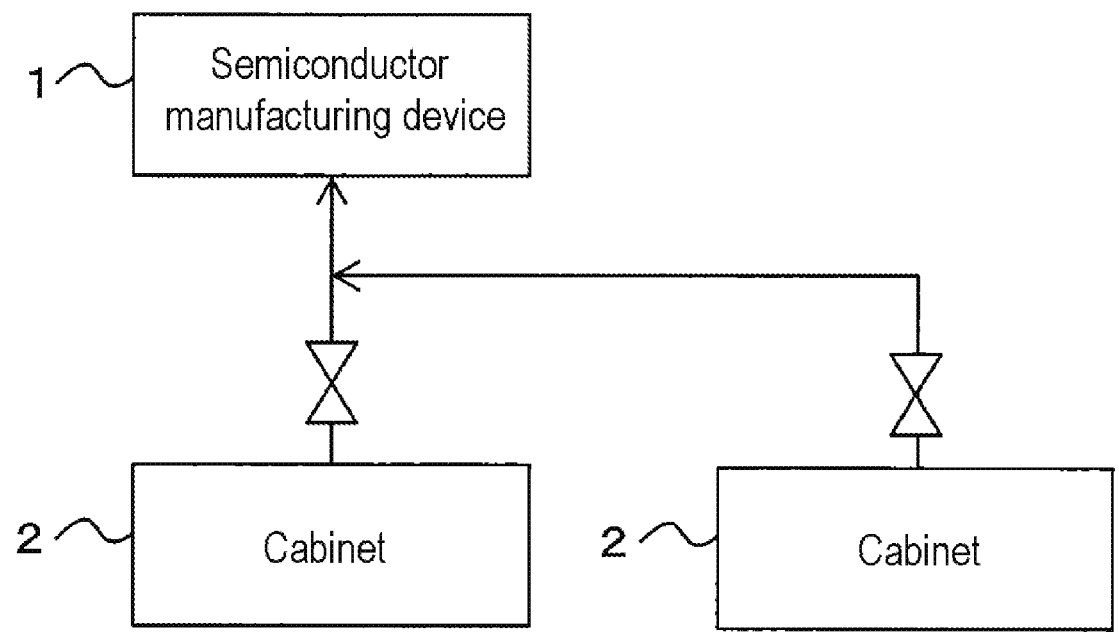
FIG. 1B is a functional block diagram of a semiconductor manufacturing device and a cabinet in another embodiment.

FIG. 1B illustrates an example of the semiconductor manufacturing device 1 and two cabinets 2 in another embodiment. In order to enable a continuous supply of sublimed gas, a plurality of cabinets (here, two) may be installed in parallel, preparations (start of solid material container heating) may be made to enable supply of the sublimed gas (entrained gas) from a second cabinet before the sublimed gas (entrained gas) from a first cabinet is stopped, and switching control such as opening a pipeline valve may be performed in such a way that the supply of the sublimed gas (entrained gas) from the second cabinet starts when the supply of the sublimed gas (entrained gas) from the first cabinet stops (valve is closed) (or immediately before stopping). This switching control may be performed by a single cabinet control portion, may be performed by cabinet control portions provided in each cabinet, or may be performed by the process control device.

Cabinet

Figure 2A:
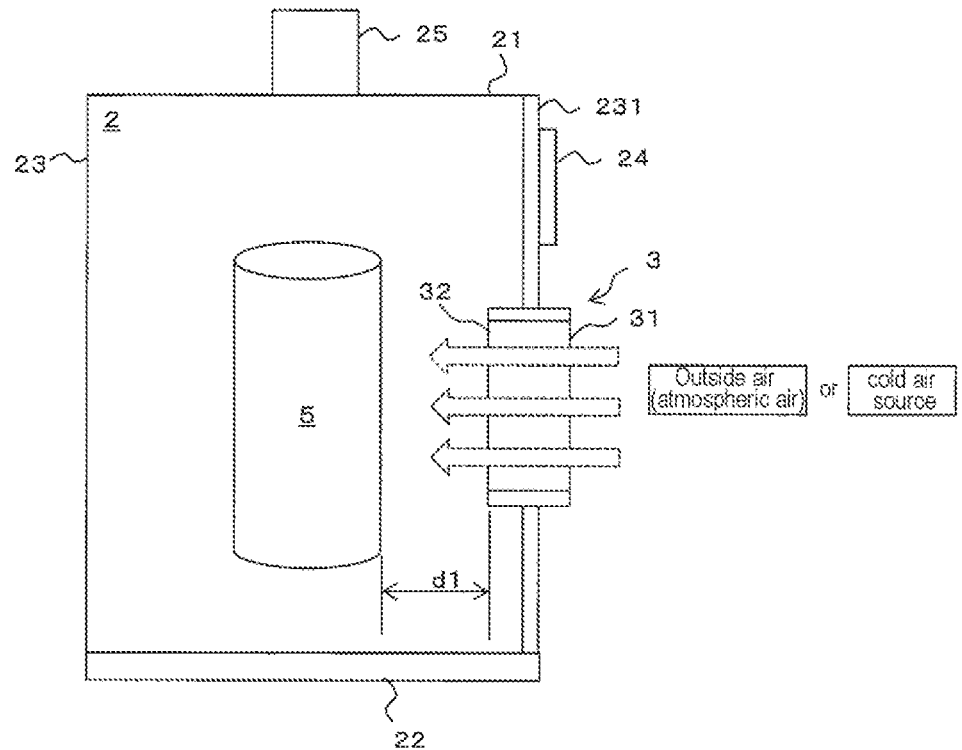
FIG. 2A is a schematic diagram of the cabinet in Embodiment 1.

FIG. 2A illustrates the configuration of the cabinet 2. The cabinet 2 is provided with a main body having a top wall 21, a side wall 23, and a bottom wall 22.

A door 231 serving as an entry/exit portion is provided in one surface of the side wall 23, and a solid material container 5 is put into and taken out through the door 231.

An exhaust duct 25 is installed in the top wall 21. The exhaust duct 25 has the function of ventilating the inside of the cabinet 2, and may, for example, include a duct ventilation blower (electric blower for intake and exhaust), a pipe, and a backflow preventing shutter or the like.

The solid material container 5 is accommodated inside the cabinet 2. A detachable electric heater jacket, which is not shown in the drawing, is attached to the solid material container 5 and is heated.

Further, a temperature sensor, which is not shown in the drawing, is attached to the detachable electric heater jacket. The temperature sensor measures an amount of heat applied to the solid material container 5, as a temperature, and feeds the measured temperature to a cabinet control portion, which is not shown in the drawing.

A cooling blower 3 is attached to the door 231. The cooling blower 3 is configured to draw in outside air or cold air from an intake portion 31, and to blow the outside air or the cold air from a blowing portion hood 32 toward a side surface of the solid material container 5.

A shortest distance (d1) from a distal end of the blowing portion hood 32 to the side surface of the solid material container 5 is preferably 1 cm to 10 cm. If the detachable electric heater jacket is attached, the shortest distance (d1) from the distal end of the blowing portion hood 32 to the side surface of the detachable electric heater jacket is preferably 1 cm to 10 cm.

In Embodiment 1, the opening surface area of the intake portion 31 and the opening surface area of the blowing portion hood 32 are the same.

The cooling blower 3 preferably has a flow rate per unit time that is at least 1.5 times, at least 2 times, or at least 3 times as high as that of the duct ventilation blower of the exhaust duct 25.

The structure of the impeller of the cooling blower 3 may, for example, be any of a sirocco, turbo, turbofan, plate, or plate fan structure.

The maximum static pressure is preferably at least equal to 0.5 kPa, more preferably at least equal to 1 kPa, and still more preferably at least equal to 10 kPa, for example.

The maximum flow rate is preferably at least equal to 100 $m^3$/min, and more preferably at least equal to 150 $m^3$/min, for example.

The cooling air is atmospheric air, and the temperature thereof is atmospheric temperature, for example.

The cooling air is not limited to atmospheric air, and may, for example, be cold air (10° C. or lower), or dry air. The cold air may be produced using a spot cooler or an air conditioner, for example.

Further, a plurality of types of airflow may be used in stages as the cooling air. For example, outside air from outside the cabinet may be used first, and then cold air used when the temperature has dropped to a prescribed temperature, or vice versa.

The intake portion 31 may include a first intake port for intake of air from the atmosphere, and a second intake port for intake of cold air from a cold air source. Opening valves are installed in each of the first and second intake ports, and the opening valves are configured to be opened and closed by the cabinet control portion.

A touch panel 24 for inputting prescribed operational values (for example, cooling air start/stop, carrier gas introduction start/stop, entrained gas supply start/stop and the like) is installed in the door 231 of the cabinet 2. The touch panel 24 also has the function of displaying various types of data (for example, set temperature, measured temperature, carrier gas flow rate/pressure, entrained gas flow rate/pressure, whether each valve is open or closed, solid material container weight or theoretical residual quantity of solid material, operating state of semiconductor manufacturing device 1, and the like).

The cabinet 2 includes a cabinet control portion (which is not shown in the drawing) for executing various types of control.

The cabinet control portion controls the temperature of the detachable electric heater jacket in such a way that the inside of the solid material container 5 reaches a prescribed temperature (for example, a temperature range in which the solid material vaporises), in accordance with an instruction from the process control device, which controls each semiconductor manufacturing device, or in accordance with a sublimed gas supply start input instruction.

The cabinet control portion receives the measured temperature from the temperature sensor in real-time or with a prescribed timing, and if a prescribed temperature range is reached, controls opening and closing of an inlet valve of the solid material container 5 and/or a control valve disposed in a carrier gas introduction pipe (which is not shown in the drawing) which introduces the carrier gas from a carrier gas source into the solid material container 5, by sending instructions to the valves, in such a way that the carrier gas is introduced into the solid material container 5.

Further, the cabinet control portion receives the measured temperature from the temperature sensor in real-time or with a prescribed timing, and if a prescribed temperature range is reached, controls opening and closing of an outlet valve of the solid material container and/or a control valve disposed in a sublimed gas delivery pipe (which is not shown in the drawing) which feeds an entrained gas of the sublimed gas obtained by vaporisation of the solid material, and the carrier gas, from the solid material container 5 to the semiconductor manufacturing device 1 side, by sending instructions to the valves, in such a way that the sublimed gas and the carrier gas are entrained with one another and are supplied to the semiconductor manufacturing device 1.

Further, as another embodiment, a pressure gauge (which is not shown in the drawing) for measuring the internal pressure (or the entrained gas pressure) in the solid material container 5 may be set in the solid material container, and the cabinet control portion may be configured to receive the measured pressure from the pressure gauge in real-time or with a prescribed timing, and if a prescribed pressure range is reached, to supply the sublimed gas, obtained by vaporisation of the solid material, and the carrier gas to the semiconductor manufacturing device 1.

In Embodiment 1, the sublimed gas delivery pipe is provided with a flow rate regulating portion and/or a pressure regulating portion for flow rate regulation and/or pressure regulation of the entrained gas. The cabinet control portion controls the entrained gas flow rate regulating portion and/or pressure regulating portion in accordance with a demand from the semiconductor manufacturing device 1.

Further, the carrier gas introduction pipe is provided with a carrier gas flow rate regulating portion and/or pressure regulating portion for flow rate regulation and/or pressure regulation of the carrier gas. The cabinet control portion controls the carrier gas flow rate regulating portion and/or pressure regulating portion in accordance with a demand from the semiconductor manufacturing device 1.

Stopping Sublimed Gas Supply

The cabinet control portion obtains the theoretical residual quantity of the solid material in the container by calculation, from the carrier gas flow rate (measured value measured by flow rate regulating portion), the saturated vapour pressure (fixed value depending on solid material), and the entrained gas feeding time (time measured using timer function).

If the theoretical residual quantity becomes equal to or less than a threshold, the cabinet control portion sends information relating thereto, or information indicating that the replacement timing has been reached, to the semiconductor manufacturing device 1. The sublimed gas can then be supplied from another cabinet, as illustrated in FIG. 1B discussed hereinabove.

If the residual quantity becomes equal to or less than a threshold, the cabinet control portion closes the control valve disposed in the sublimed gas delivery pipe and/or the outlet valve of the solid material container by sending instructions thereto, in such a way as to stop the feed of the entrained gas to the semiconductor manufacturing device 1. Further, a control valve disposed in the carrier gas introduction pipe and/or the inlet valve of the solid material container is closed by sending instructions thereto. Here, the "threshold" is, for example, 5% to 8% of the weight of the solid material filling the solid material container 5.

The cabinet control portion stops the supply of electric power to the detachable electric heater jacket.

Cooling of Solid Material Container

A first cooling mode in which cooling is performed after the detachable electric heater jacket has been removed, and a second cooling mode in which cooling is performed without removing the detachable electric heater jacket, can be set. The setting may be set in advance to one of the modes, or the configuration may be such that an operator inputs an instruction from the touch panel 24 when control is performed to stop the supply of the sublimed gas and to carry out cooling.

First Cooling Mode (1) The cabinet control portion stops the feed of the entrained gas to the semiconductor manufacturing device 1, and stops the supply of electric power to the detachable electric heater jacket.

(2) The operator removes the detachable electric heater jacket from the solid material container 5 in the cabinet 2.

(3) The operator inputs a cooling start instruction using the touch panel 24.

In response to this instruction, the cabinet control portion drives the cooling blower 3.

(4) The cabinet control portion stops the cooling blower 3 when the temperature measured by a thermometer installed in the solid material container, or measured by a non-contact type thermometer installed in the cabinet 2 and set in such a way as to measure an outer surface temperature of the solid material container 5 becomes equal to or less than a threshold. The "threshold" is, for example, 40° or lower, or atmospheric temperature.

(5) The transition of the measured temperature is displayed in real-time on the touch panel 24, and when the temperature has become equal to or less than the threshold, the cabinet control portion may cause the touch panel 24 to display information indicating that cooling is complete, or the configuration may be such that a notification is issued to a mobile terminal of the operator, for example.

Second Cooling Mode (1) The cabinet control portion stops the feed of the entrained gas to the semiconductor manufacturing device 1, and stops the supply of electric power to the detachable electric heater jacket.

(2) The cabinet control portion drives the cooling blower 3.

(3) The cabinet control portion stops the cooling blower 3 when the temperature measured by the thermometer installed in the solid material container, or measured by the non-contact type thermometer installed in the cabinet 2 and set in such a way as to measure the outer surface temperature of the solid material container 5, becomes equal to or less than a threshold. The "threshold" is, for example, 40° or lower, or atmospheric temperature.

(4) The transition of the measured temperature is displayed in real-time on the touch panel 24, and when the temperature has become equal to or less than the threshold, the cabinet control portion may cause the touch panel 24 to display information indicating that cooling is complete, or the configuration may be such that a notification is issued to a mobile terminal of the operator, for example.

The cabinet control portion can be physically separate from the cabinet 2, and may be implemented using an information processing device (smartphone, tablet, or personal computer, for example, having a communication function) capable of remotely controlling each constituent element by issuing control instructions thereto. The cabinet control portion may be implemented by cooperation between various control programs and processors, or may be configured using dedicated circuits or firmware, or the like, either singly or in various configurations.

The cabinet control portion is configured to be capable of transmitting and receiving (irrespective of whether by wireless or by wire) data to or from the touch panel 24, various instruments (flowmeter, pressure gauge, flow rate regulating portion, pressure regulating portion, temperature sensor, thermometer and the like), and the semiconductor manufacturing device 1.

Figure 2B:
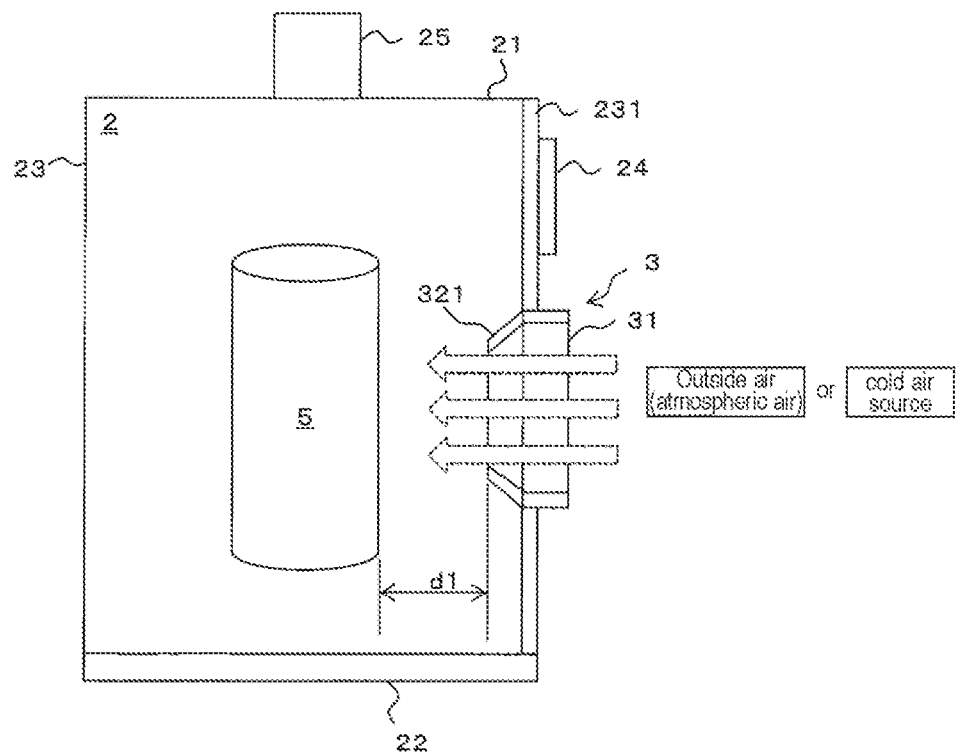
FIG. 2B is a schematic diagram of the cabinet in another embodiment.

Other Embodiments (1) FIG. 2B illustrates a configuration of the cooling blower 3 in which the opening surface area of a blowing portion hood 321 is smaller than the opening surface area of the blowing portion 31. As a result, the wind speed can be increased compared with FIG. 2A, and the cooling effect can be improved.

Figure 3A:
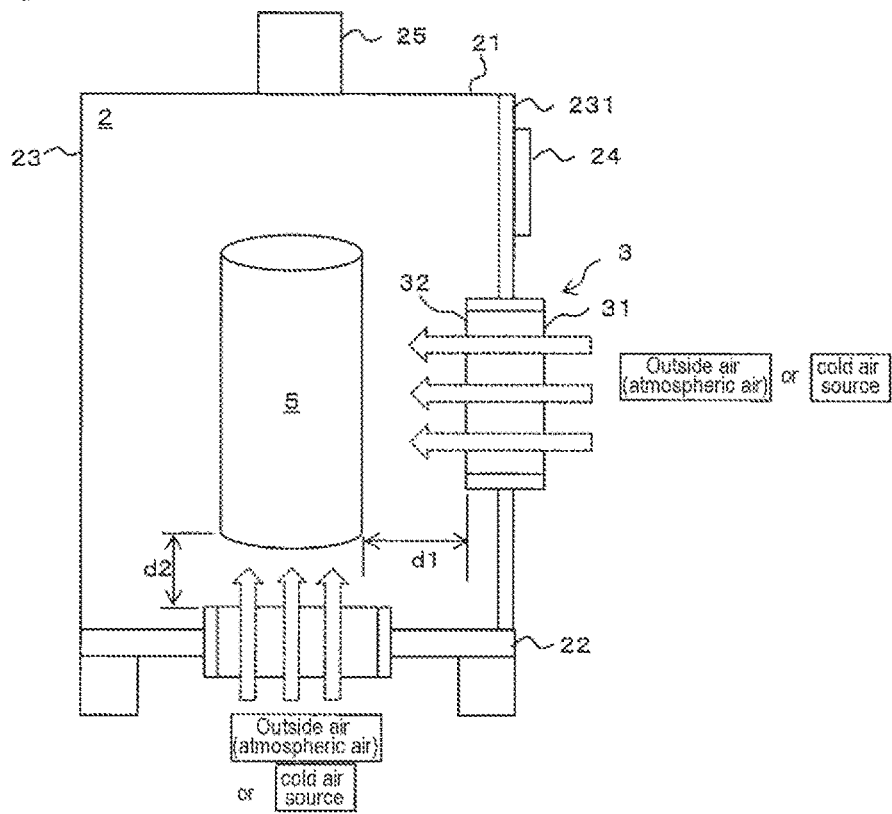
FIG. 3A is a schematic diagram of the cabinet in another embodiment.

(2) FIG. 3A illustrates a configuration in which, in addition to the configuration in FIG. 2A, a second cooling blower 4 is installed in the bottom wall 22. The second cooling blower 4 is configured to draw in outside air or cold air from an intake portion, and to blow the outside air or the cold air from a blowing portion hood toward a bottom surface of the solid material container 5.

A shortest distance (d2) from a distal end of the blowing portion hood to the bottom surface of the solid material container 5 is preferably 1 cm to 10 cm. If the detachable electric heater jacket is attached to the bottom surface, the shortest distance (d2) from the distal end of the blowing portion hood to the bottom surface of the detachable electric heater jacket is preferably 1 cm to 10 cm.

In FIG. 3A, the opening surface area of the intake portion and the opening surface area of the blowing portion hood are the same, but the opening surface area of the blowing portion hood may be smaller.

Figure 3B:
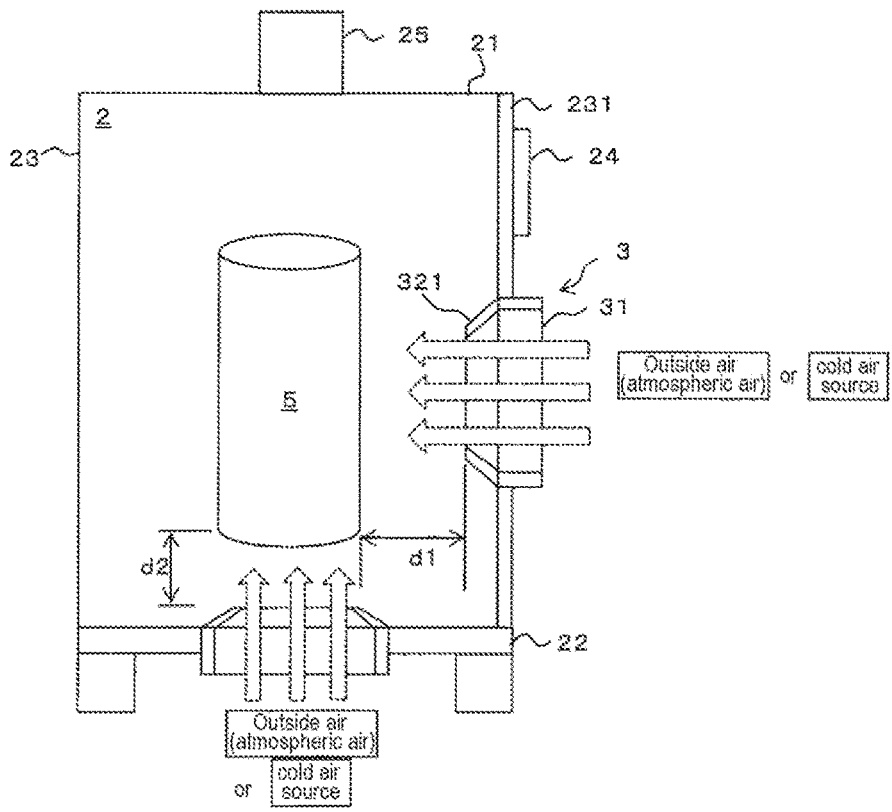
FIG. 3B is a schematic diagram of the cabinet in another embodiment.

(3) FIG. 3B illustrates a configuration in which, in addition to the configuration in FIG. 2B, the second cooling blower 4 is installed in the bottom wall 22. The second cooling blower 4 is configured to draw in outside air or cold air from an intake portion, and to blow the outside air or the cold air from a blowing portion hood toward a bottom surface of the solid material container 5.

A shortest distance (d2) from a distal end of the blowing portion hood to the bottom surface of the solid material container 5 is preferably 1 cm to 10 cm. If the detachable electric heater jacket is attached to the bottom surface, the shortest distance (d2) from the distal end of the blowing portion hood to the bottom surface of the detachable electric heater jacket is preferably 1 cm to 10 cm.

In FIG. 3B, the opening surface area of the blowing portion hood is smaller than the opening surface area of the intake portion, but the opening surface area of the intake portion and the opening surface area of the blowing portion hood may be the same.

(4) The cooling blower 3 is not limited to being installed in the door 231, and may be installed in the side wall or the top wall of the cabinet.

(5) The number of cooling blowers is not limited to one or two, and there may be three or more.

(6) The cooling blower is not limited to having one blowing portion, and may have a plurality of blowing portions, each of which may be installed in such a way as to be capable of blowing from an arbitrarily defined direction on the side surface of the solid material container.

Exemplary Embodiment

Figure 4:
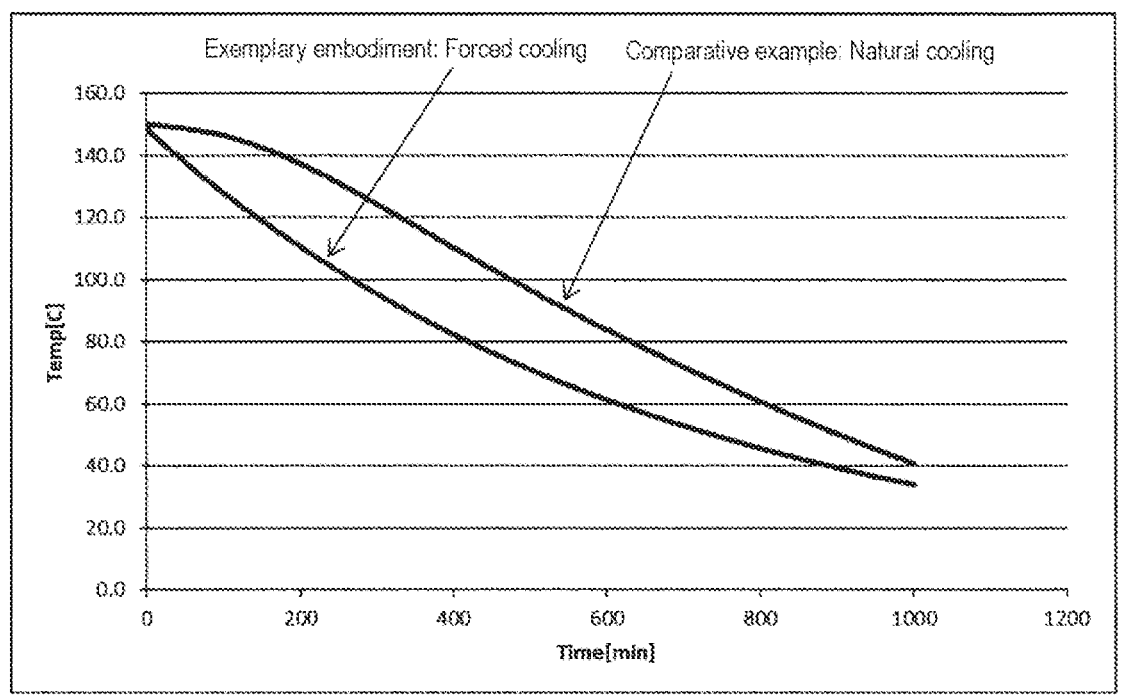
FIG. 4 is a drawing illustrating cooling time transitions in an exemplary embodiment and in a comparative example.

FIG. 4 illustrates transitions over time in temperature decreases in an exemplary embodiment in which forced cooling is performed with the configuration in FIG. 2A of Embodiment 1, and in a comparative example in which natural cooling occurs without forced cooling. Cooling was started after the detachable electric heater jacket had been removed.

Solid material container: made from stainless steel, with an internal volume of 18 L and a wall thickness of 0.28 cm
Flow rate of cooling blower: 150 m$^3$/min
Temperature range of supplied fluid (air): 15° C. to 25° C.
Shortest distance (d1): 10 cm
Temperature at start of cooling: 150° C. (measured temperature from temperature sensor)
Exemplary embodiment (forced cooling): Time to decrease to 50° C. was 720 minutes, and time to decrease to 40° C. was 880 minutes.
Comparative example (natural cooling): Time to decrease to 50° C. was 910 minutes, and time to decrease to 40° C. was 1000 minutes.

The exemplary embodiment was able to effect cooling approximately 200 minutes more quickly than the comparative example, and had a high cooling effect. Further, the cooling rate can be increased by increasing the capability of the cooling blower. In addition, the cooling rate can be increased further by employing cold air as the supplied fluid.

EXPLANATION OF THE REFERENCE CODES

1 Semiconductor manufacturing device
2 Cabinet
21 Top wall
22 Bottom wall
23 Side wall
24 Touch panel
25 Exhaust duct
3 Cooling blower
31 Intake portion
32 Blowing portion (hood)
5 Solid material container It will be understood that many additional changes in the details, materials, steps and arrangement of parts, which have been herein described in order to explain the nature of the invention, may be made by those skilled in the art within the principle and scope of the invention as expressed in the appended claims. Thus, the present invention is not intended to be limited to the specific embodiments in the examples given above.

What is claimed is:

1. A cabinet for a solid material container containing a solid material, the cabinet comprising:
    a main body having a top wall, a side wall, and a bottom wall;
    an entry/exit door, which is attached to a portion of the main body of the cabinet, configured to permit putting in and taking out the solid material container to and from the main body of the cabinet;
    an exhaust duct attached to a portion of the main body of the cabinet;
    a detachable electric heater jacket configured to heat the solid material container; a temperature sensor configured to measure a temperature of the solid material container, or of the detachable electric heater jacket;
    a cooling blower configured to blow cooling air toward the solid material container;
    an operation input portion of an electronic controller configured to input transmit prescribed operational values, and configured to set a first cooling mode that cools the solid material container after removing the detachable electric heater jacket, and a second cooling mode that cools the solid material container without removing the detachable electric heater jacket.

2. The cabinet for a solid material container according to claim 1, wherein, in the cooling blower, an opening surface area of an intake portion and an opening surface area of a blowing portion are the same or substantially the same.

3. The cabinet for a solid material container according to claim 1, wherein, in the cooling blower, an opening surface area of a blowing portion is smaller than an opening surface area of an intake portion.

4. The cabinet for a solid material container according to claim 1, wherein a distance between a hood distal end of a blowing portion of the cooling blower and the solid material container, or the detachable electric heater jacket covering the solid material container, is at most equal to 10 cm.

5. The cabinet for a solid material container according to claim 1, further comprising
    a touch panel for displaying a temperature measured by the temperature sensor and/or a temperature set in the detachable electric heater jacket.

6. The cabinet for a solid material container according to claim 1, wherein the electronic controller is configured to control the detachable electric heater jacket in such a way that an inside of the solid material container reaches a prescribed temperature.

7. The cabinet for a solid material container according to claim 1, further comprising:
    an inlet valve and an outlet valve of the solid material container;
    a carrier gas introduction pipe;
    a sublimed gas delivery pipe configured to feed a sublimed gas obtained by vaporization of the solid material from the solid material container and a carrier gas to a reaction chamber;
    a control valve disposed in the sublimed gas delivery pipe;
    a control valve disposed in the carrier gas introduction pipe; and
    the electronic controller configured to control to close the control valve disposed in the sublimed gas delivery pipe and/or the outlet valve of the solid material container, and/or to close the control valve disposed in the carrier gas introduction pipe and/or the inlet valve of the solid material container by sending instructions thereto, and stop feeding the sublimed gas and/or the carrier gas to the reaction chamber when a weight of the solid material container or a residual quantity of the solid material in the solid material container becomes equal to or less than a threshold.

8. The cabinet for a solid material container according to claim 1, further comprising
    an inlet valve and an outlet valve of the solid material container;
    a carrier gas introduction pipe;

a sublimed gas delivery pipe configured to feed a sublimed gas obtained by vaporization of the solid material from the solid material container and a carrier gas to a reaction chamber;
a control valve disposed in the sublimed gas delivery pipe;
a control valve disposed in the carrier gas introduction pipe; and
the electronic controller configured to drive the cooling blower after stopping feeding the sublimed gas and the carrier gas to the reaction chamber, and configured to stop the cooling blower when the temperature measured by the temperature sensor has become equal to or less than a threshold.

* * * * *